(12) United States Patent
Li et al.

(10) Patent No.: US 11,878,821 B2
(45) Date of Patent: Jan. 23, 2024

(54) VIBRATION ISOLATION/DAMPING SATELLITE MOUNT MADE OF CHOPPED CARBON FIBER REINFORCED THERMOPLASTIC COMPOSITE MATERIAL

(71) Applicant: Dalian University of Technology, Dalian (CN)

(72) Inventors: Tong Li, Dalian (CN); Fei Niu, Dalian (CN); Hui Ye, Dalian (CN); Bo Wang, Dalian (CN)

(73) Assignee: Dalian University of Technology, Dalian (CN)

( * ) Notice: Subject to any disclaimer, the term of this patent is extended or adjusted under 35 U.S.C. 154(b) by 0 days.

(21) Appl. No.: 18/155,356

(22) Filed: Jan. 17, 2023

(65) Prior Publication Data
US 2023/0227181 A1   Jul. 20, 2023

(30) Foreign Application Priority Data
Jan. 18, 2022   (CN) .......................... 202210053722.8

(51) Int. Cl.
  *B64G 1/66*   (2006.01)
  *G06F 30/23*  (2020.01)
  *B64G 1/22*   (2006.01)
(52) U.S. Cl.
  CPC ............... *B64G 1/66* (2013.01); *G06F 30/23* (2020.01); *B64G 1/228* (2023.08)
(58) Field of Classification Search
  CPC ...... B64G 1/66; B64G 2001/228; G06F 30/23
  (Continued)

(56) References Cited

U.S. PATENT DOCUMENTS

| 11,327,465 B2 * | 5/2022 | Doehring | ........... G05B 19/4099 |
| 2006/0114169 A1 * | 6/2006 | Aisenbrey | ............... B32B 27/34 |
| | | | 343/840 |

(Continued)

FOREIGN PATENT DOCUMENTS

| CN | 112208039 A | 1/2021 |
| CN | 212407442 U | 1/2021 |

OTHER PUBLICATIONS

Capovilla et al. (Modular Multifunctional Composite Structure for CubeSat Applications: Preliminary Design and Structural Analysis, Aerospace 2020, 7, 17; doi:10.3390/aerospace7020017) (Year: 2020).*

(Continued)

*Primary Examiner* — Iftekhar A Khan
(74) *Attorney, Agent, or Firm* — McCormick, Paulding & Huber PLLC

(57) ABSTRACT

A vibration isolation/damping satellite mount of a chopped carbon fiber reinforced thermoplastic composite material mainly includes two parts, and the two parts are connected through bolts. Considering the limitation of the molding process, the mount configuration is further optimized, and the mount structure is prepared by using the injection molding process. Furthermore, the vibration isolation/damping satellite mount of the chopped carbon fiber reinforced thermoplastic composite material prepared in the present invention can be used for large loads and complex working conditions, and the connectivity, overall strength stability, vibration isolation performance and service life of the mount all meet the design requirements. The present invention provides an efficient optimization design and manufacturing method for engineering manufacturing of thermoplastic composite materials, and vibration isolation/damping satellite mount manufactured by the method is low in cost, high in practicability and easy to produce on a large scale.

3 Claims, 4 Drawing Sheets

(58) Field of Classification Search
USPC .......................................................... 703/2
See application file for complete search history.

(56) References Cited

U.S. PATENT DOCUMENTS

| | | | | |
|---|---|---|---|---|
| 2012/0313307 | A1* | 12/2012 | Cartwright | C08J 5/046 267/141 |
| 2014/0118213 | A1* | 5/2014 | Blalock | H01Q 19/10 343/834 |
| 2014/0155540 | A1* | 6/2014 | Imai | C08L 71/08 524/592 |
| 2017/0259502 | A1* | 9/2017 | Chapiro | B29C 64/241 |
| 2018/0209508 | A1* | 7/2018 | Barber | F16F 15/023 |
| 2019/0210922 | A1* | 7/2019 | Li | C04B 26/02 |
| 2019/0299522 | A1* | 10/2019 | Chapiro | B29C 70/38 |
| 2020/0023584 | A1* | 1/2020 | Portela | B29C 64/30 |
| 2021/0060882 | A1* | 3/2021 | Shah | B29C 70/34 |
| 2022/0106063 | A1* | 4/2022 | Johnson | B64G 1/645 |
| 2022/0282766 | A1* | 9/2022 | Pu | F16F 15/08 |
| 2022/0333372 | A1* | 10/2022 | Uchida | E04B 1/8409 |
| 2023/0211901 | A1* | 7/2023 | Bottlinger | B64G 1/641 267/141 |

OTHER PUBLICATIONS

Chandra et al. (Mechanical and Thermomechanical Properties of Carbon Fibre Reinforced Thermoplastic Composite Fabricated Using Fused Deposition Modelling (FDM) Method: A Review, International Journal of Mechanical and Production, 2018, pp. 1162-1168) (Year: 2018).*

Rajak et al. (Manufacturing Technologies of Carbon/Glass Fiber-Reinforced Polymer Composites and Their Properties: A Review, MDPI, 2021, pp. 1-42) (Year: 2021).*

* cited by examiner

VIBRATION ISOLATION/DAMPING SATELLITE MOUNT MADE OF CHOPPED CARBON FIBER REINFORCED THERMOPLASTIC COMPOSITE MATERIAL

CROSS-REFERENCE TO RELATED APPLICATION

This application claims foreign priority benefits under 35 U.S.C. § 119 from Chinese Patent Application No. 202210053722.8, filed Jan. 18, 2022, the content of which is hereby incorporated by reference in its entirety.

TECHNICAL FIELD

The present disclosure belongs to the technical field of lightweight design and manufacturing of aerospace and the like, and relates to the structurally reinforced design of a mount of a chopped carbon fiber reinforced thermoplastic composite material, in particular to a vibration isolation/damping satellite mount of a chopped carbon fiber reinforced thermoplastic composite material.

BACKGROUND

The chopped carbon fiber reinforced thermoplastic composite material has excellent specific strength, rigidity, anisotropy, corrosion resistance, fatigue resistance, shock absorption, energy absorption and other characteristics, and the application of the material in modern aerospace and automobile fields has been increased rapidly. The outstanding characteristics of the chopped carbon fiber reinforced thermoplastic composite material are not only used for reducing the weight of the structure, but also improving the overall performance of the structure. Compared with a thermosetting composite material, the chopped carbon fiber reinforced thermoplastic composite material has the advantages of low density, high specific strength, excellent impact resistance, corrosion resistance and good hygrothermal property. Furthermore, the thermoplastic composite material has the advantages of convenience in storage, high molding efficiency, fusable welding, reduced manufacturing cycle, repeated heating and melting, reusing and cost saving. These characteristics make the thermoplastic composite material attractive for many structural applications. In order to meet the requirements on light weight and overall performance in various fields of current society, and with the continuous development of molding technology of the chopped carbon fiber reinforced thermoplastic composite material, the chopped carbon fiber reinforced thermoplastic composite material will be more widely used in aerospace field.

As the installation platform for important electrical systems such as gyroscopes, navigation equipment and control systems on launch vehicles or missiles, the satellite mount is extremely important to avoid the failure of spacecraft missions caused by vibration response affecting the normal operation of instruments and equipment and improve the structural performance of the satellite integrated controller mount. Generally speaking, the vibration bore by the satellite mount mainly comes from the random vibration generated by the engine, buffeting and impact caused by external air flow. Therefore, in order to ensure that the spacecraft can work normally in hostile environments, it is necessary to put forward higher requirements on the vibration isolation/damping performance of the satellite mount. However, the existing satellite mount is insufficient in lightweight design and poor in vibration damping performance, so the existing satellite mount needs to be further improved. Under the application background, the present disclosure provides a mount with high vibration isolation/damping performance while considering the lightweight design and ensuring the structural strength of the satellite mount.

SUMMARY

The technical problem to be solved mainly by the present disclosure is that the existing satellite mount is insufficient in lightweight design and lacks damping, resulting in insufficient vibration damping capacity.

In order to solve the technical problem, the solution adopted by the present disclosure is as follows.

A vibration isolation/damping satellite mount of a chopped carbon fiber reinforced thermoplastic composite material is provided. The vibration isolation/damping satellite mount includes a bearing surface cylinder area and four bridge-type supporting legs, where a top of each bridge-type supporting leg is of a triangular vertical plate force transmission structure, a lower end of the bridge-type supporting leg is of a ribbed reinforcing structure, and the bridge-type supporting leg is of an integrated molding structure.

The bearing surface cylinder area is located on a top of the mount, and includes bearing surface connecting bolt holes 7, cylinder bearing surfaces 4, limited blocks 5, a cylinder structure 6 and cylinder structure bolt holes 8; four groups of cylinder structure bolt holes 8 are provided and uniformly distributed in the cylinder structure 6. Each group of cylinder structure bolt holes 8 includes two rows of bolt holes, and the cylinder structure 6 is connected with upper ends of the bridge-type supporting legs 14 through the four groups of cylinder structure bolt holes 8; an inner side of the cylinder structure 6 is uniformly provided with four cylinder bearing surfaces 4 (with the same structure as the cylinder bearing surface 4 of the traditional mount, as shown in FIG. 3), positions of the four cylinder bearing surfaces 4 correspond to positions of the four groups of cylinder structure bolt holes 8. An end of each cylinder bearing surface 4 is provided with a bearing surface connecting bolt hole 7, and the cylinder bearing surface 4 is connected with an integrated controller or other equipment placed on the cylinder bearing surface 4 through the bearing surface connecting bolt hole 7; two limited blocks 5 are arranged on two adjacent cylinder bearing surfaces 4, symmetrically distributed and configured for limiting installation positions of the integrated controller or the other equipment.

The four bridge-type supporting legs 14 have same structures and are improved on a basis of original supporting leg filling areas 2, and each bridge-type supporting leg 14 is of a box structure with an open top and comprises one bottom surface and two side surfaces. A hollow area between the two side surfaces and the one bottom surface is a second topological hole 13; positions where the two side surfaces are connected with the one bottom surface are symmetrically provided with groove structures as first topological holes 12, for stability and light weight of the force transmission structure; the first topological holes 12 are close to the triangular vertical plate force transmission structure area.

A top of the bridge-type supporting leg 14 is provided with the triangular vertical plate force transmission structure area; each triangular vertical plate force transmission structure area comprises an arc-shaped connecting plate 11, a vertical plate supporting structure 9, a triangular vertical plate supporting piece 9-1, supporting leg connecting bolt holes 16 and cylinder-supporting-leg connecting bolts 10. Two rows of supporting leg connecting bolt holes 16 are symmetrically provided in the arc-shaped connecting plate 11; positions of the supporting leg connecting bolt holes 16 correspond to those of the cylinder structure bolt holes 8, for passing the connecting bolts 10; an outer side surface of the arc-shaped connecting plate 11 is connected with the inner side of the cylinder structure 6 through the cylinder-supporting-leg connecting bolts 10. The triangular vertical plate supporting piece 9-1 is arranged in a middle of an inner side of the arc-shaped connecting plate 11, the vertical plate supporting structure 9 is plate-shaped and arranged on an inclined plane of the triangular vertical plate supporting piece 9-1, and the vertical plate supporting structure 9 and the triangular vertical plate supporting piece 9-1 form a triangular supporting structure and are fixed below the cylinder bearing surface 4. The triangular vertical plate force transmission structure is designed in such shape mainly in order to stabilize the force transmission structure and achieve the purpose of weight reduction.

The ribbed reinforcing structure 15 composed of a first diagonal rod 15-1 and a second diagonal rod 15-2 is arranged at a bottom of the bridge-type supporting leg 14. Two side surfaces of a lower part of the bridge-type supporting leg 14 are of hollow structures, and the first diagonal rod 15-1 and the second diagonal rod 15-2 arranged in the two side surfaces are distributed in a "八" shape, so as to reinforce the stability of the structure and prevent a lower end of the bridge-type supporting leg from being torsionally deformed.

A design method of a vibration isolation/damping satellite mount of a chopped carbon fiber reinforced thermoplastic composite material includes following steps:

1) carrying out a standard tensile test of the composite material to obtain an elastic constant and Poisson's ratio of the chopped carbon fiber reinforced thermoplastic composite material;
2) creating a finite element analysis framework for a component made of the thermoplastic composite material, and performing a deformation mode analysis on an original mount configuration under working condition load;
3) designing and establishing an optimization model according to load conditions in actual engineering conditions, and using a generalized algorithm in a topological optimization method to carry out optimization design of structural parts of the mount, establishing and solving an optimization mathematical model with minimum strain energy as an optimization objective and with mass and frequency as optimization constraints to determine a conceptual reference diagram;
4) on a basis of topological optimization, carrying out parametric modeling; and parametric modeling analysis and result extraction are parametric analysis programs of structural parts, developed based on ABAQUS. Based on Isight software, dimension optimization is performed on the structural parts in detail until the optimization result is in convergence to obtain an optimal design of the structural parts.
5) modifying a configuration of the component optimized in combination with a molding process to prepare the structural parts by injection molding.

A preparation method of the vibration isolation/damping satellite mount of the chopped carbon fiber reinforced thermoplastic composite material includes the following steps: injecting 35% of chopped carbon fiber into polyphenylene sulfide (PPS), and forming through high-temperature and high-pressure injection molding of thermoplastic resin or forming through vacuum infusion integrated molding of a specific low-viscosity thermoplastic resin system; the curing process is fast, the processing cycle is short, and the production efficiency is high.

In some embodiments, the melting point of the chopped carbon fiber reinforced PPS composite material is 285° C., and the holding pressure is 50-90 MPa.

In some embodiments, drying is needed before injection molding, the drying temperature is between 100° C. and 140° C., the drying time is 3.5-4.5 hours, and the composite material is placed in the mold.

In some embodiments, the supporting leg is prepared by injection molding of the chopped carbon fiber reinforced PPS composite material, the injection temperature is 300-330° C. (the preferred temperature mechanism is 300° C., 310° C., 320° C. and 330° C.), and the injection molding pressure is 100-180 MPa.

In some embodiments, by modifying the optimized component configuration in combination with the molding process, the quality of the prepared component can be improved, and defects such as matrix aggregation, bubbles, voids and the like can be avoided.

Compared with the prior art, the present disclosure has the following beneficial effects.

The present disclosure provides a design flow suitable for the vibration isolation/damping satellite mount of the chopped carbon fiber reinforced thermoplastic composite material. An optimization model is created according to specific working conditions, the optimization design for the material and the shapes of structural parts is realized, and the overall dimensions of the structural parts of the composite material are parameterized, so that the degree of freedom of lightweight design is greatly improved. Furthermore, the vibration isolation/damping satellite mount of the chopped carbon fiber reinforced thermoplastic composite material prepared by the present disclosure can meet the reliable requirements in the connectivity, overall strength stability, vibration isolation performance and service life under the conditions of large load and complex working conditions. The present disclosure provides an efficient optimization design method for engineering manufacturing of thermoplastic composite materials, and the mount manufactured by the method is low in cost, high in practicability and easy to produce on a large scale.

Figure 1:
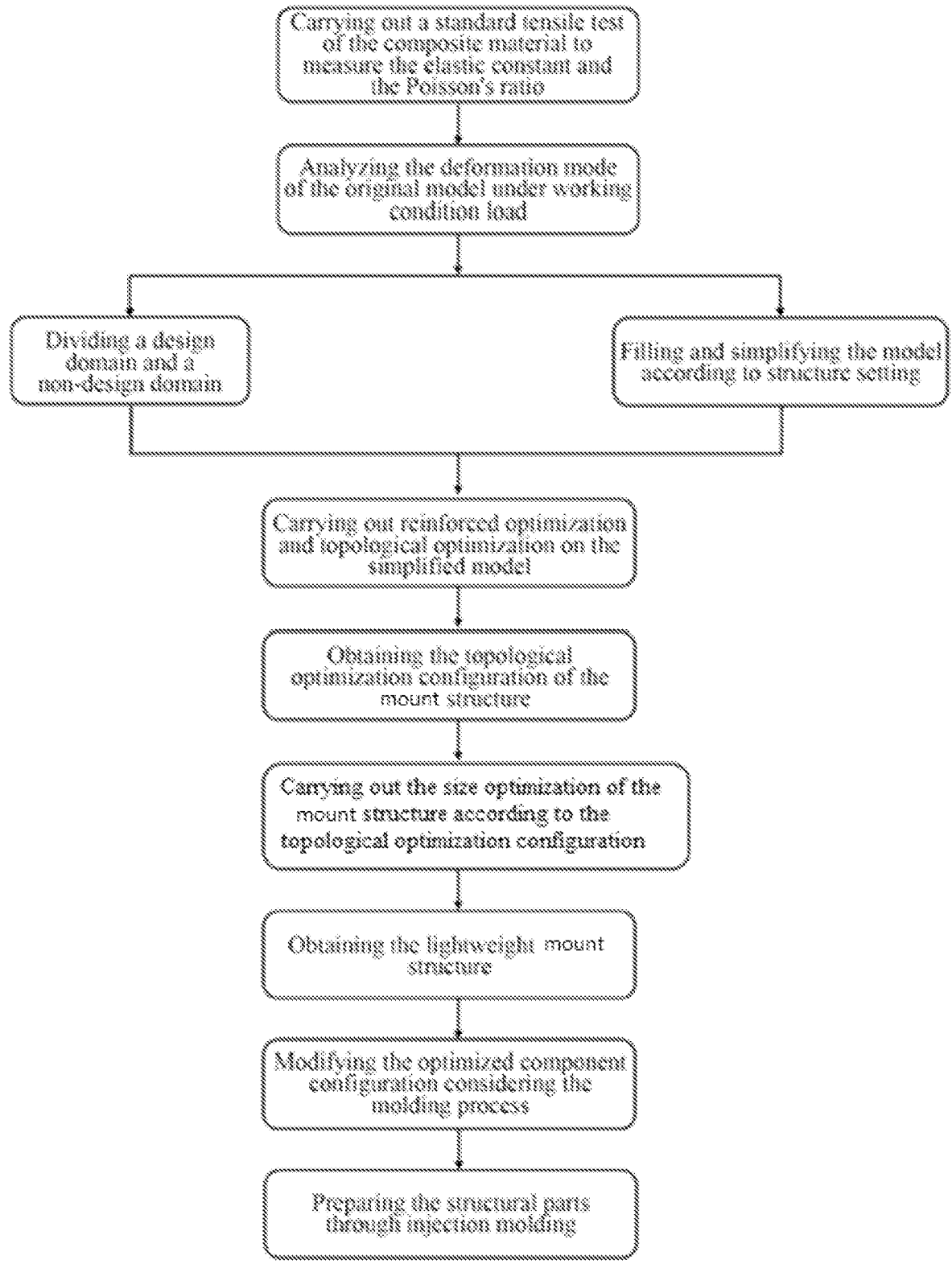
FIG. 1 is a flow diagram of an optimum design method of a vibration isolation/damping satellite mount of a chopped carbon fiber reinforced thermoplastic composite material provided by the present disclosure.

Reference numerals: 1 cuboid force transmission structure; 2 supporting leg filling area; 3 initial cylinder; 4 cylinder bearing surface; 5 limited block; 6 cylinder structure; 7 bearing surface connecting bolt hole; 8 cylinder structure bolt hole; 9 vertical plate supporting structure; 9-1 triangular vertical plate supporting piece; 10 cylinder-supporting-leg connecting bolt; 11 arc-shaped connecting plate; 12 first topological hole; 13 second topological hole; 14 bridge-type supporting leg structure; 15 ribbed reinforcing structure; 15-1 first diagonal rod; 15-2 second diagonal rod; and 16 supporting-leg connecting bolt hole.

DETAILED DESCRIPTION OF THE EMBODIMENTS

In order to make the solved technical problems, the adopted technical scheme and the achieved technical effect of the present disclosure clearer, the present disclosure is further explained in detail with reference to the accompanying drawings and embodiments. It is understandable that the specific embodiments described herein are illustrative only and are not restrictive of the present disclosure.

In Embodiment 1, disclosed is a design method of a vibration isolation/damping satellite mount of a chopped carbon fiber reinforced PPS composite material, the design method includes the following steps.

Figure 2:
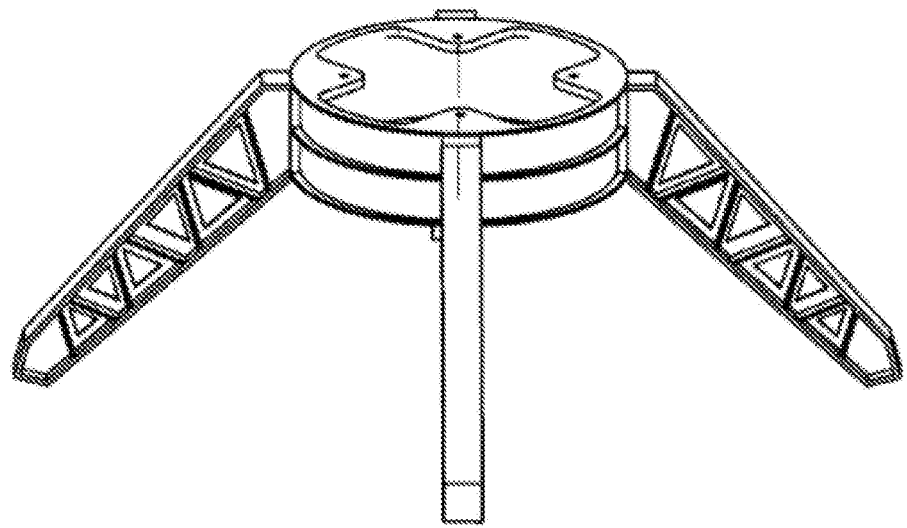
FIG. 2 is a structural schematic diagram of an initial body of the satellite mount.

1) A standard tensile test is performed to test basic mechanical property of the composite material so as to obtain an elastic constant and Poisson's ratio, where the tensile elasticity modulus of the composite material is 28 GPa, and the Poisson's ratio is 0.35;

2) A finite element model of an initial body of the satellite mount is created, where the finite element model is made of aluminum alloy and has a mass of 7.0 Kg, as shown in FIG. 2; an analysis of bearing capacity is performed on the finite element model so as to obtain the bearing surface displacement of 0.12 mm under a static load of 1764 N, and then a random vibration analysis is performed on the finite element model, where the power spectral density function of the random vibration is the real and reliable data obtained, based on the actual test of the rocket during launching, and the weight of the equivalent mass is 12 Kg.

Figure 3:
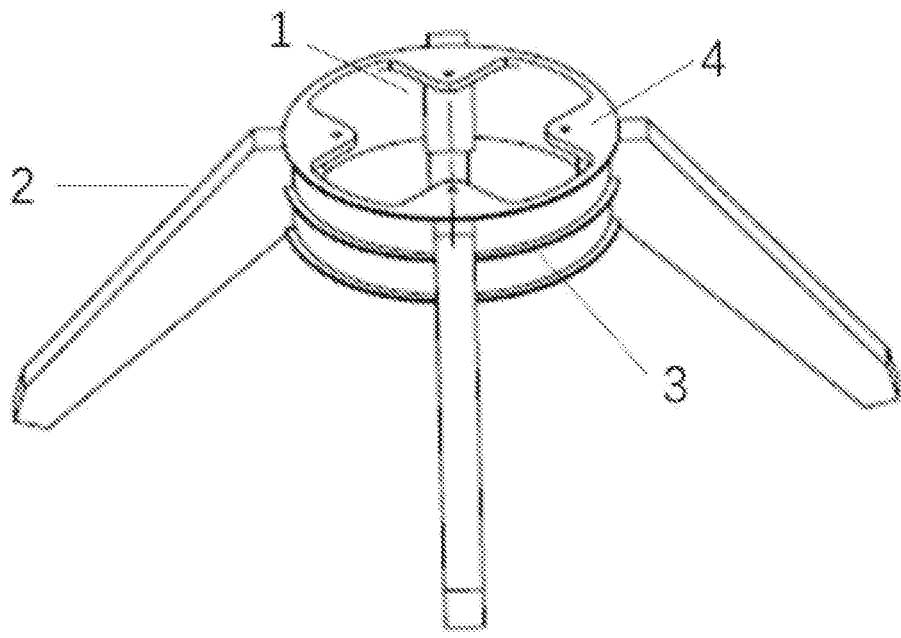
FIG. 3 is a structural schematic diagram used for topological optimization.

3) The initial body structure of the satellite mount is filled necessarily to expand the design domain thereof, as shown in FIG. 3. Referring to FIG. 3, the to-be-optimized model of the satellite mount is created, where a cuboid force transmission structure 1, a supporting leg filling area 2, an initial cylinder 3 and a cylinder bearing surface 4 are additionally provided.

4) Based on the finite element analysis software, the to-be-optimized model of the satellite mount is created. The to-be-optimized model includes the cuboid force transmission structure 1, the supporting leg filling area 2 and the initial cylinder 3 area in the middle. An outer contour of the to-be-optimized model is matched with that of the initial body structure of the satellite mount.

The expanded support area is selected as a design domain and a non-design domain, and topological optimization design is carried out. The topological optimization design includes the steps of establishing an optimization task; creating an optimized response; setting constraint conditions; establishing objective functions; providing geometric constraints; and obtaining an ideal optimization result. Axial overload is set as loading condition for topological optimization, frequency and mass are set as constraint conditions for topological optimization, and minimum strain energy is set as an optimization target of topological optimization, and the geometric constraints are set as rotational symmetry.

Figure 4:
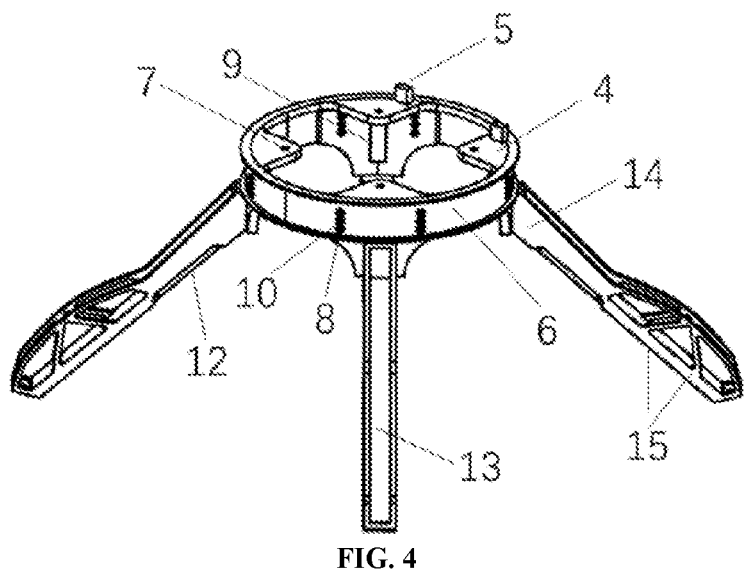
FIG. 4 is a structural schematic diagram of an optimization design in the present disclosure.
Figure 5:
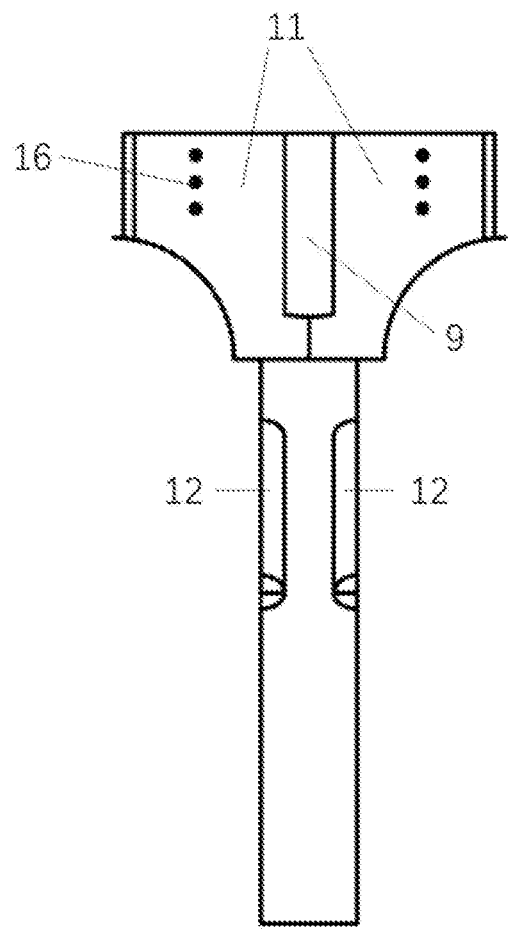
FIG. 5 and FIG. 6 are local structural schematic diagrams of an optionally designed supporting leg in the present disclosure.

5) According to the conceptual reference drawing obtained from topological optimization, based on the parametric analysis program of structural parts which is developed based on ABAQUS, the automatic modeling, analysis and post-processing of the structural parts are realized, and the post-processing results are imported into the self-developed structural optimization design program to perform detailed size optimization of the mount to obtain a final design drawing of the mount structure. The optimized structural parts are modified according to the molding process, as shown in FIG. 4. Finally, the structural parts are prepared by injection molding.

Figure 6:
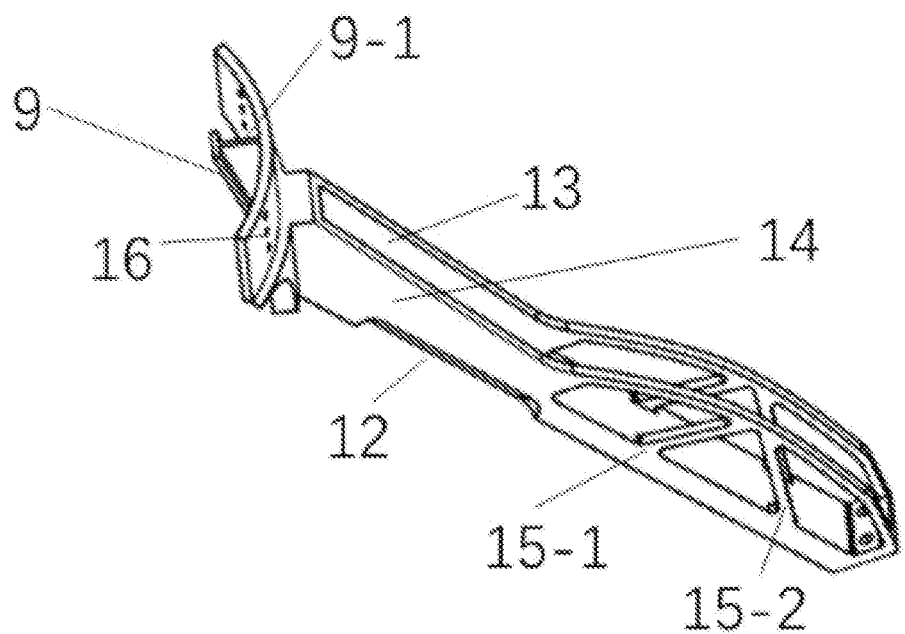

Specifically, a final configuration of the embodiment is as shown in FIG. 4. Four bolt holes in the cylinder bearing surface 4 are configured for fixing the integrated controller and other equipment. A vertical plate supporting structure 9 arranged below the cylinder bearing surface 4 is integrally formed with the supporting leg, thereby facilitating the stability of the force transmission structure. In order to reinforce strength of the force transmission structure, in this embodiment, a triangular vertical plate supporting piece 9-1 (FIG. 6) is arranged in a middle of the triangular vertical plate. A middle surface of the cylinder and a side surface of the supporting leg are fixed through cylinder-supporting-leg connecting bolts 10. A lower part and a hollow part of the supporting leg form a bridge-type force transmission structure 14 provided according to a first topological hole 12 and a second topological hole 13. A lower hollow area of the cylinder is a material removal area, namely a cylinder structure 6, provided according to the arc-shaped connecting plate 11. In order to prevent a lower end of the bridge-type supporting leg from being torsionally deformed, a ribbed reinforcing structure 15 is added, that is, a first diagonal rod 15-1 and a second diagonal rod 15-2 (FIG. 6) are of "A" shape, and the corresponding dimensions of the ribbed reinforcing structure 15 are optimized and adjusted. It should be noted that in this embodiment, the four bridge-type supporting legs are all distributed around the cylinder in an array, and the four bridge-type supporting legs are completely the same in structures.

The strength, rigidity and anti-vibration characteristics of the optimized vibration isolation/damping satellite mount of the chopped carbon fiber reinforced thermoplastic composite material in FIG. 4 are verified through simulation.

Strength working condition: the axial load is applied, the stress of the vibration isolation/damping satellite mount of the chopped carbon fiber reinforced thermoplastic composite material is obtained under the axial load, and the obtained stress is lower than the yield limit of the chopped carbon fiber reinforced thermoplastic composite material.

Rigidity working condition: the bearing surface displacement of the vibration isolation/damping satellite mount of the chopped carbon fiber reinforced thermoplastic composite material is 0.1 mm through verification, meeting the design requirements.

Vibration working condition: the inherent frequency of the vibration isolation/damping satellite mount of the chopped carbon fiber reinforced thermoplastic composite material is 101.7 Hz through verification, meeting the design requirements.

Power amplification factor: after random vibration analysis is carried out under given load spectrum, the power amplification factor of the coupling point of the mass block is 1.6, meeting the design requirements.

Mass: the mass of the vibration isolation/damping satellite mount of the chopped carbon fiber reinforced thermoplastic composite material is 3.8 Kg through verification.

Furthermore, Embodiment 1 of the application can also be illustrated by Contrast Embodiment 1.

Contrast Embodiment 1

The strength, rigidity and anti-vibration characteristics of the initial body structure of the satellite mount as shown in FIG. 2 are verified through simulation.

Strength working condition: the axial load is applied, the stress of the initial body of the satellite mount under the axial load is obtained, and the obtained stress is lower than the yield limit of the aluminum alloy.

Rigidity working condition: the bearing surface displacement of the initial body of the satellite mount is 0.12 mm through verification, and does not exceed the technical requirement index.

Vibration working condition: the inherent frequency of the initial body of the satellite mount is 109.5 Hz through verification, meeting the design requirements.

Power amplification factor: after random vibration analysis is carried out under given load spectrum, the power amplification factor of the coupling point of the mass block is 2.6.

Mass: the mass of the initial body of the satellite mount is 7.0 Kg through verification.

It is found that under the condition that both the strength and the rigidity are met, the vibration isolation/damping satellite mount of the chopped carbon fiber reinforced thermoplastic composite material (FIG. 4) has a total weight loss of 3.2 Kg compared with the initial body structure of the satellite mount (FIG. 2), and the weight loss efficiency is 45%. The power amplification factor of the coupling point of the mass block of the vibration isolation/damping satellite mount of the chopped carbon fiber reinforced thermoplastic composite material (FIG. 4) is 40% lower than that of the initial body structure of the satellite mount (FIG. 2). Therefore, the vibration isolation/damping satellite mount of the chopped carbon fiber reinforced thermoplastic composite material has good vibration isolation/damping performance.

Therefore, the design process and preparation method of the vibration isolation/damping satellite mount of the chopped carbon fiber reinforced thermoplastic composite material in Embodiment 1 are selected, and it is ensured that the connectivity, overall strength stability, vibration isolation performance and service life of the mount can meet the reliable requirements under the conditions of large load and complex working conditions. Moreover, the mount manufactured by the injection molding is low in cost, high in practicability and easy to produce on a large scale.

What is said above is just an embodiment of the present disclosure, the present disclosure is not restricted by the above-mentioned embodiments, it should be noted that, for those skilled in the art without departing from the concept of the present disclosure, a number of improvements and modifications can be made, such modifications and improvements also be considered to fall within the scope of the present disclosure.

What is claimed is:

1. A vibration isolation/damping satellite mount of a chopped carbon fiber reinforced thermoplastic composite material, wherein the vibration isolation/damping satellite mount comprises a bearing surface cylinder area and four bridge-type supporting legs, wherein a top of each bridge-type supporting leg is of a triangular vertical plate force transmission structure, a lower end of the bridge-type supporting leg is of a ribbed reinforcing structure, and the bridge-type supporting leg is of an integrated molding structure;

the bearing surface cylinder area is located on a top of the mount, and comprises bearing surface connecting bolt holes, cylinder bearing surfaces, limited blocks, a cylinder structure and cylinder structure bolt holes; four groups of cylinder structure bolt holes are provided and uniformly distributed in the cylinder structure, wherein each group of cylinder structure bolt holes comprises two rows of bolt holes, and the cylinder structure is connected with upper ends of the bridge-type supporting legs through the four groups of cylinder structure bolt holes; an inner side of the cylinder structure is uniformly provided with four cylinder bearing surfaces, positions of the four cylinder bearing surfaces correspond to positions of the four groups of cylinder structure bolt holes, an end of each cylinder bearing surface is provided with a bearing surface connecting bolt hole, and the cylinder bearing surface is connected with an integrated controller or other equipment placed on the cylinder bearing surface through the bearing surface connecting bolt hole; two limited blocks are arranged on two adjacent cylinder bearing surfaces, symmetrically distributed and configured for limiting installation positions of the integrated controller or the other equipment;

the four bridge-type supporting legs have same structures and are improved on a basis of original supporting leg filling areas, and each bridge-type supporting leg is of a box structure with an open top and comprises one bottom surface and two side surfaces, wherein a hollow area between the two side surfaces and the one bottom surface is a second topological hole; positions where the two side surfaces are connected with the one bottom surface are symmetrically provided with groove structures as first topological holes, and the first topological holes are close to the triangular vertical plate force transmission structure area;

a top of the bridge-type supporting leg is provided with the triangular vertical plate force transmission structure area; each triangular vertical plate force transmission structure area comprises an arc-shaped connecting plate, a vertical plate supporting structure, a triangular vertical plate supporting piece, supporting leg connecting bolt holes and cylinder-supporting-leg connecting bolts; two rows of supporting leg connecting bolt holes are symmetrically provided in the arc-shaped connecting plate, positions of the supporting leg connecting bolt holes correspond to those of the cylinder structure bolt holes, and an outer side surface of the arc-shaped connecting plate is connected with the inner side of the cylinder structure through the cylinder-supporting-leg connecting bolts; the triangular vertical plate supporting piece is arranged in a middle of an inner side of the arc-shaped connecting plate, the vertical plate supporting structure is plate-shaped and arranged on an inclined plane of the triangular vertical plate supporting piece, and the vertical plate supporting structure and the triangular vertical plate supporting piece form a triangular supporting structure and are fixed below the cylinder bearing surface;

two side surfaces of a lower part of the bridge-type supporting leg are of hollow structures, and ribbed reinforcing structures are arranged in the hollow structures; and wherein the ribbed reinforcing structures comprise first diagonal rods and second diagonal rods, and the first diagonal rods and the second diagonal rods are distributed in a "A" shape, so as to reinforce stability of the ribbed reinforcing structures, and prevent lower ends of the bridge-type supporting legs from being torsionally deformed.

2. A design method of a vibration isolation/damping satellite mount of a chopped carbon fiber reinforced thermoplastic composite material, comprising the following steps:

carrying out a standard tensile test of the composite material to obtain an elastic constant and Poisson's ratio of the chopped carbon fiber reinforced thermoplastic composite material;

creating a finite element analysis framework for a component made of the thermoplastic composite material, and performing a deformation analysis on different mount configuration under working condition load;

designing and establishing an optimization model according to load conditions in actual engineering conditions, and using a generalized algorithm in a topological optimization method to carry out optimization design of structural parts of the mount, establishing and solving an optimization mathematical model with minimum strain energy as an optimization objective and with mass and frequency as optimization constraints to determine a conceptual reference diagram;

on a basis of topological optimization, carrying out parametric modeling to obtain an optimal design of the structural parts; and modifying a configuration of the component optimized in combination with a molding process to prepare the structural parts by injection molding.

3. The design method of a vibration isolation/damping satellite mount of a chopped carbon fiber reinforced thermoplastic composite material according to claim 2 wherein a process of the injection molding is as follows: injecting 35% of chopped carbon fiber into polyphenylene sulfide (PPS), and forming through high-temperature and high-pressure injection molding of thermoplastic resin or forming through vacuum infusion integrated molding of a specific low-viscosity thermoplastic resin system.

* * * * *